United States Patent
Yuen et al.

(10) Patent No.: US 6,748,352 B1
(45) Date of Patent: Jun. 8, 2004

(54) METHOD AND APPARATUS FOR SCAN DESIGN USING A FORMAL VERIFICATION-BASED PROCESS

(75) Inventors: Joel T. Yuen, Mesa, AZ (US); Kailasnath S. Maneparambil, Chandler, AZ (US); Puneet Singh, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,942

(22) Filed: Dec. 30, 1999

(51) Int. Cl.⁷ .............................................. G06F 17/50
(52) U.S. Cl. ................ 703/16; 716/5; 716/18
(58) Field of Search .................. 703/16, 15; 716/5, 716/18; 714/33, 724, 726; 324/158.1; 327/202

(56) References Cited

U.S. PATENT DOCUMENTS

| | | | | |
|---|---|---|---|---|
| 4,937,827 A | * | 6/1990 | Beck et al. ..................... | 714/33 |
| 5,068,603 A | * | 11/1991 | Mahoney ...................... | 714/726 |
| 5,541,849 A | * | 7/1996 | Rostoker et al. .............. | 716/18 |
| 5,572,437 A | * | 11/1996 | Rostoker et al. .............. | 716/18 |
| 5,646,567 A | * | 7/1997 | Felix ........................... | 327/202 |
| 5,847,561 A | * | 12/1998 | Whetsel ................... | 324/158.1 |
| 5,943,489 A | * | 8/1999 | Shiratori ...................... | 703/16 |
| 6,170,072 B1 | * | 1/2001 | Moriguchi et al. ......... | 714/724 |
| 6,247,165 B1 | * | 6/2001 | Wohl et al. ..................... | 716/5 |
| 6,295,636 B1 | * | 9/2001 | Dupenloup .................. | 716/18 |
| 6,321,186 B1 | * | 11/2001 | Yuan et al. ..................... | 703/15 |
| 6,446,230 B1 | * | 9/2002 | Chung ........................ | 714/726 |

OTHER PUBLICATIONS

Srinivinas, N.C.E.; Agrawal, V.D., "Formal verification of digital circuits using hybrid simulation," IEEE Circuits and Devices Magazine, vol.: 4 Issue: 1, Jan. 1988, pp. 19–27.*
Narendran, P.; Stillman, J., "Formal verification of the Sobel image processing chip," Proceedings of the 25th ACM/IEEE Design Automation Conference, 1988, pp.: 211–217.*
Wohl, P.; Waicukauski, J., "Using ATPG for clock rules checking in complex scan designs," The 15th IEEE VLSI Test Symposium, 1997, pp.: 130–136.*
Macil et al., E. Formal Verification of Digital Systems by Automatic Reduction of Data Paths, IEEE Transactions on Computer–Aided Design of Integrated Circuits and Systems, vol. 16, No. 10, Oct. 1997, pp. 1136–1156.*
Heitmeyer et al., C. Using Abstraction and Model Checking to Detect Safety Violations in Requirements Specifications, IEEE Transactions on Software Engineering, vol. 24, No. 11, Nov. 1998, pp. 927–948.*
Chau, S. Fault Injection Boundary Scan Design for Verification of Fault Tolerant Systems, IEEE, International Test Conference, 1994, pp. 677–682.*

* cited by examiner

*Primary Examiner*—Russell Frejd
(74) *Attorney, Agent, or Firm*—Cynthia T. Faatz

(57) ABSTRACT

A scan cell design approach includes removing a formal verification property associated with a scan cell from a set of formal verification properties to create a reduced set of formal verification properties. A formal verification assumption verification process is then performed on a schematic using assumptions generated from the reduced set of formal verification properties. An output of the assumption verification process indicates whether there is a potential contention site at logic coupled to the output of the scan cell.

20 Claims, 5 Drawing Sheets

METHOD AND APPARATUS FOR SCAN DESIGN USING A FORMAL VERIFICATION-BASED PROCESS

BACKGROUND

1. Field

An embodiment of the present invention relates to the field of integrated circuit design and, more particularly, to the design of integrated circuits including scan cells.

2. Discussion of Related Art

A typical design process for an integrated circuit begins with architecture design followed by a logic design phase that produces a register transfer level (RTL) model of the integrated circuit and a circuit design phase that produces a switch level schematic. Once a switch level schematic is available, a formal verification (FV) process may be performed to verify that the schematic and the RTL model are functionally equivalent (verify the schematic against the RTL).

While an FV process may be used to verify the schematic against the RTL model for a normal operating mode of the integrated circuit, if scan cells are included in the design, there may be issues during scan operations that were not revealed during FV. Vectors shifted into scan cells through the scan chains included in the integrated circuit may cause contention that is not detected by the FV process, for example.

FIG. 1 shows an example of a portion 100 of an integrated circuit to be verified. The circuit 100 includes control lines 105–107 that act as select lines for the multiplexer (mux) 110. The mux 110 receives input values on input lines 111–113 and provides an output at node 115. In this example, during a normal mode of operation, the logic 120 is configured to ensure that only one of the select lines 105–107 is asserted at any one time. During this normal mode of operation, scan cells 126–128 coupled to outputs of the logic 120 act as simple latches that pass output values from the logic 120 through a scan cell fan-out cone 130 to the select lines 105–107 of the mux 110.

By ensuring that only one of the select lines 105–107 is asserted at once, contention is avoided at the output node 115 in the case that different input values are received on the input lines 111–113. Contention at the output node 115 creates a DC current path that can damage a chip that includes the integrated circuit 100 and/or compromise its reliability.

While contention at a mux output node 115 is described above, contention may also occur on a bus with a similar configuration (e.g. a tristate bus), for example, in a similar manner and may be even more problematic.

During an FV process to verify the circuit 100, where FV is performed at sequential logic boundaries, the logic 120 does not control the values of the control signals 105–107 because there is a sequential boundary at the scan chain 125. Thus, one or more FV properties may be specified at the inputs of the logic 130 to constrain the controlling signals 105–107 such that only one of the signals can be asserted at any one time. An example of such a property may be MUTEX (105, 106, 107) (where MUTEX indicates mutually exclusive).

When FV is performed on the circuit 100 using this FV property, contention is avoided at the output node 115 during the FV process.

An issue may arise, however, during scan testing, when test vectors are shifted into the scan chain and/or when they are applied to the signal lines 105, 106 and 107. During such testing, the logic 120 does not have control over the values of the signals applied to the signal lines 105–107. Because any combination of values may be shifted into the scan cells 126–128 during scan testing, contention may be caused at the output node 115 either during a shift operation or as the vector shifted into the scan chain is otherwise applied to the signal lines 105–107.

Currently, such sites where contention may occur during scan testing can be difficult to detect. One approach is to exhaustively simulate all possible test vectors that may be applied to each scan chain. Another approach is to inspect contention sites manually after an issue, such as wafer or circuit damage, has occurred. Such processes are time consuming, may require additional expertise, may be subject to human error and/or may happen late in the manufacturing cycle such that any design changes are expensive to make.

Where immediate damage to a chip does not occur as a result of contention, or the circumstances that cause the contention are relatively rare, some manufacturers may choose to ignore the issue. Quality or reliability of the integrated circuit chip may be compromised as a result.

Another approach is to design scan cells that do not cause contention. This may be done, for example, by avoiding the use of tristate elements. Such a design approach may, however, unacceptably compromise the speed of the integrated circuit. Alternatively, scan cells may be designed to hold their state such that contention issues are avoided during scan shift operations. Some scan cells designed in this manner may result in increased area and operation overhead.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for scan design using a formal verification-based process are described. In the following description, particular types of integrated circuits, integrated circuit configurations and systems are described for purposes of illustration. It will be appreciated, however, that other embodiments are applicable to other types of integrated circuits and to systems and integrated circuits configured in another manner.

In accordance with one embodiment, formal verification property(ies) associated with scan cell functional outputs are removed from an integrated circuit RTL model. For one embodiment, this is accomplished through an iterative assumption verification process on the RTL model as described in more detail below in reference to FIG. 3. A formal verification assumption verification process is then performed on a schematic that has been previously verified against the RTL model. An output of the formal verification process identifies potential contention sites at logic coupled to scan cell output(s). If the contention occurs when the test vectors are applied to the logic at outputs of the scan cells, the specified formal verification property(ies) which are converted to automatic test pattern generation (ATPG) constraints and provided to ATPG tools can prevent the contention. The ATPG tool uses the constraints to generate test vectors for the integrated circuit that includes the scan cells.

Using the above approach, potential contention sites caused by scan cells included within an integrated circuit can be identified early in the design cycle such that any resultant design changes are less expensive to implement. Further, in accordance with this embodiment, test vectors can be intelligently generated by an ATPG tool to provide good test coverage while avoiding contention at logic coupled to scan cell outputs.

Figure 2:
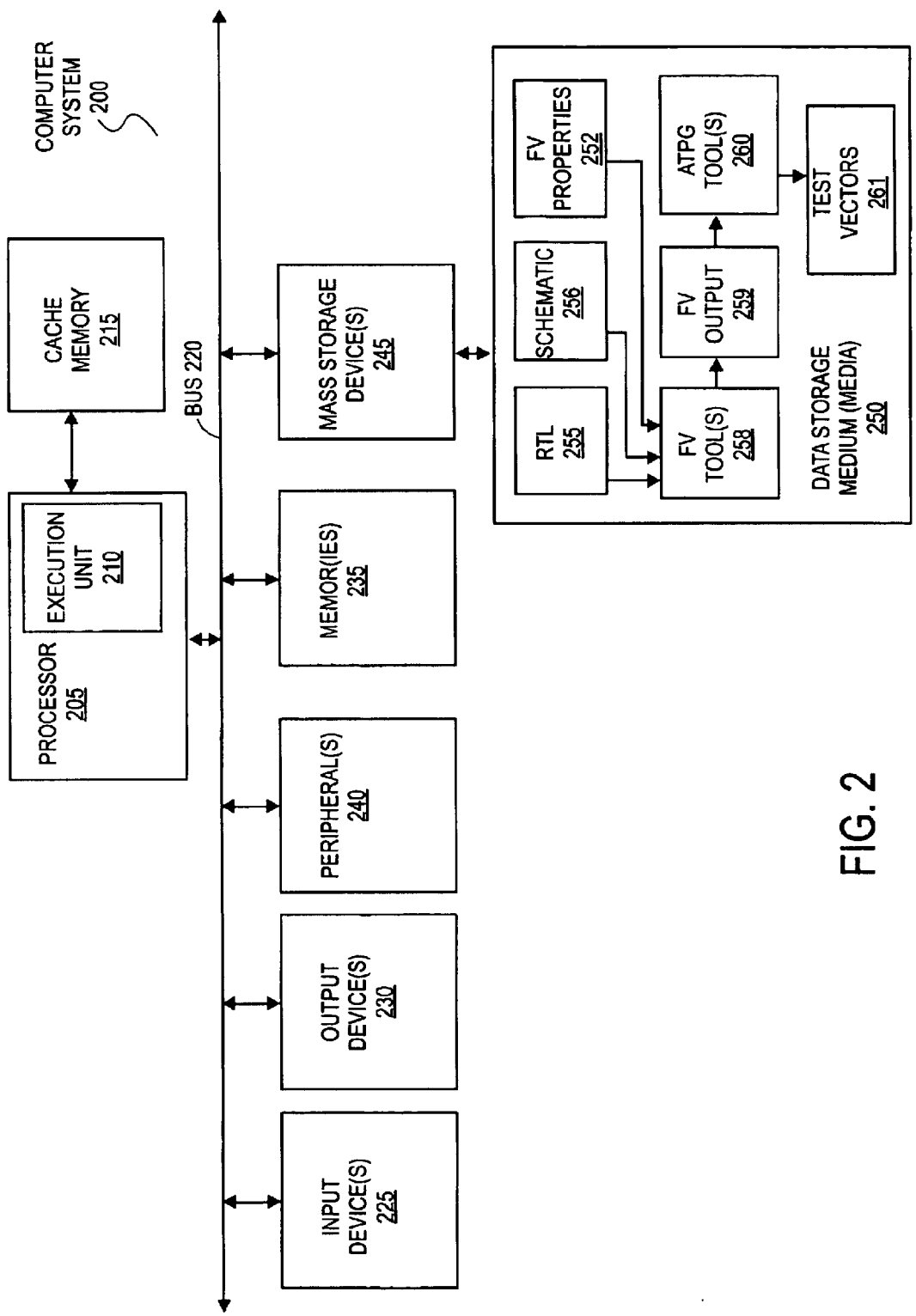
FIG. 2 is a block diagram of a computer system in which a formal verification tool and/or a test pattern generator of one embodiment may be implemented.

FIG. 2 is a block diagram of a computer system 200 in which the scan design method and apparatus of one embodiment may be implemented. For this embodiment, the computer system 200 is a workstation computer system such as a Hewlett Packard HP 9000 Enterprise Server manufactured by Hewlett Packard Company of Palo Alto, Calif. Other types of workstations and/or other types of computer systems are within the scope of various embodiments.

The computer system 200 includes a processor 205 that executes instructions using an execution unit 210. A cache memory 215 may be coupled to the processor 205 to store recently and/or frequently used instructions. The processor 205 is coupled to a bus 220 to communicate information between the processor 205 and other components in the computer system 200.

Also coupled to the bus 220 are one or more input devices 225, such as a keyboard and/or a cursor control device, one or more output devices 230, such as a monitor and/or printer, one or more memories 235 (e.g. random access memory (RAM), read only memory (ROM), etc.), other peripherals 240 (e.g. memory controller, graphics controller, bus bridge, etc.), and one or more mass storage devices 245.

The mass storage device(s) 245 may include a hard disk drive, a compact disc read only memory (CD ROM) drive and/or an optical disk drive, for example. Further, the mass storage device(s) 245 may include additional mass storage device(s) that are accessible by the computer system 200 over a network (not shown).

A corresponding data storage medium (or media) 250 (also referred to as computer-readable storage medium) may be used to store instructions, data and/or one or more programs to be executed by the processor 200. For one embodiment, the data storage medium (or media) 250 stores instructions in the form of programs and information 255–261 that are used in scan design.

For this embodiment, an RTL model 255 and switch-level schematic model 256 for a particular integrated circuit are stored on the data storage medium 250 or in another memory of the computer system 200 along with formal verification (FV) properties 257 associated with the RTL model and/or schematic 256. In accordance with one embodiment, at a given point in the integrated circuit design cycle, as described in more detail below, the FV properties 257 are manipulated to remove FV properties that correspond to scan cell functional outputs from one of the models.

Assumptions used in formal verification are generated from the FV properties. One or more FV tool(s) 258 is then used to perform an FV assumption verification process on the schematic 256 using assumptions generated from the reduced set of FV properties.

Output information 259 from the FV process indicates potential contention sites at logic coupled to scan cells in the schematic 256. This FV output information 259 may then be used to provide constraints to one or more ATPG tool(s) 260 that generate test vectors 261 for the integrated circuit that is the subject of the schematic 256 and RTL model 255 as described in more detail below.

While one computer system 200 and one data storage medium 250 are shown in FIG. 2, it will be appreciated that for some embodiments, the information and programs 255–261 may each be stored on one or more different data storage media on one or more different computer systems.

Figure 3:
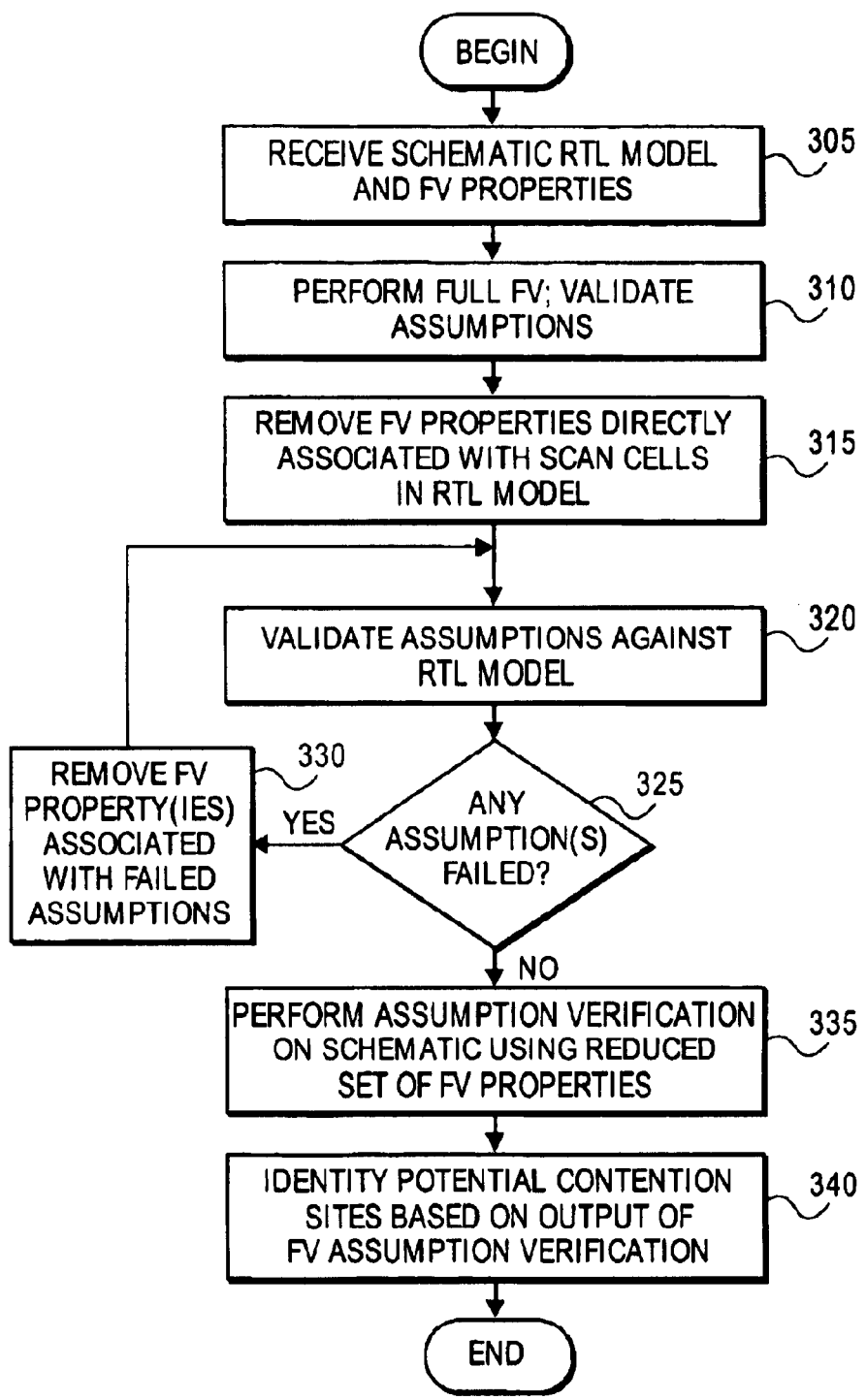
FIG. 3 is a flow diagram showing the method of one embodiment for identifying potential contention sites associated with scan cells.

FIG. 3 is a flow diagram showing one embodiment of a method that may be used in designing scan cells in an integrated circuit. At block 305, a switch-level schematic model and RTL model of the integrated circuit are received along with formal verification (FV) properties corresponding to the RTL model and/or the schematic. The RTL model may be developed from a higher level architectural design using a programming language such as VHDL or Verilog, for example. Other approaches for developing RTL models are within the scope of various embodiments.

For some embodiments, FV properties may be specified as assert statements included within the RTL model which specify functional conditions (or functional operating conditions) associated with certain combinatorial logic blocks. These functional conditions are specified by designers of the logic blocks, for example, to avoid contention and/or to otherwise ensure proper operation of the logic blocks during a normal operating mode. Once the RTL model has been developed, for some embodiments, the RTL model may be simulated to verify it against the architecture specification.

The schematic may be developed based on the RTL model using other well-known, commercially available tools such as, for example, Opus Schematic Editor and/or Composer from Cadence Design Systems, Inc. of San Jose, Calif. or Design Compiler from Synopsys of Mountain View, Calif., for example. Other approaches for developing a schematic from an RTL model are also within the scope of various embodiments.

The schematic may also be annotated with formal verification properties that may be specified by the integrated circuit designer, for example. These formal verification properties may indicate functional conditions that are similar to or in addition to the functional conditions specified by the assert statements in the RTL model.

FV properties for particular control lines are typically specified by the integrated circuit designer(s) in the RTL model and/or the schematic to indicate functional conditions that are to be placed on the control lines in order for the integrated circuit to perform correctly in a functional mode (i.e. normal operating mode) and to aid the verification process. The types of FV properties specified for a given circuit may depend on the FV tool that is being used. For one embodiment, and in the description below, the FV tool 258 performs formal verification on sequential logic boundaries. In other words, an integrated circuit schematic may be divided up into combinatorial logic blocks at sequential logic boundaries such that each of the combinatorial logic blocks may be verified separately. Thus, the FV properties specified for a given combinatorial circuit block may depend on function(s) performed by logic that is outside a sequential logic boundary associated with that circuit block.

Figure 1:
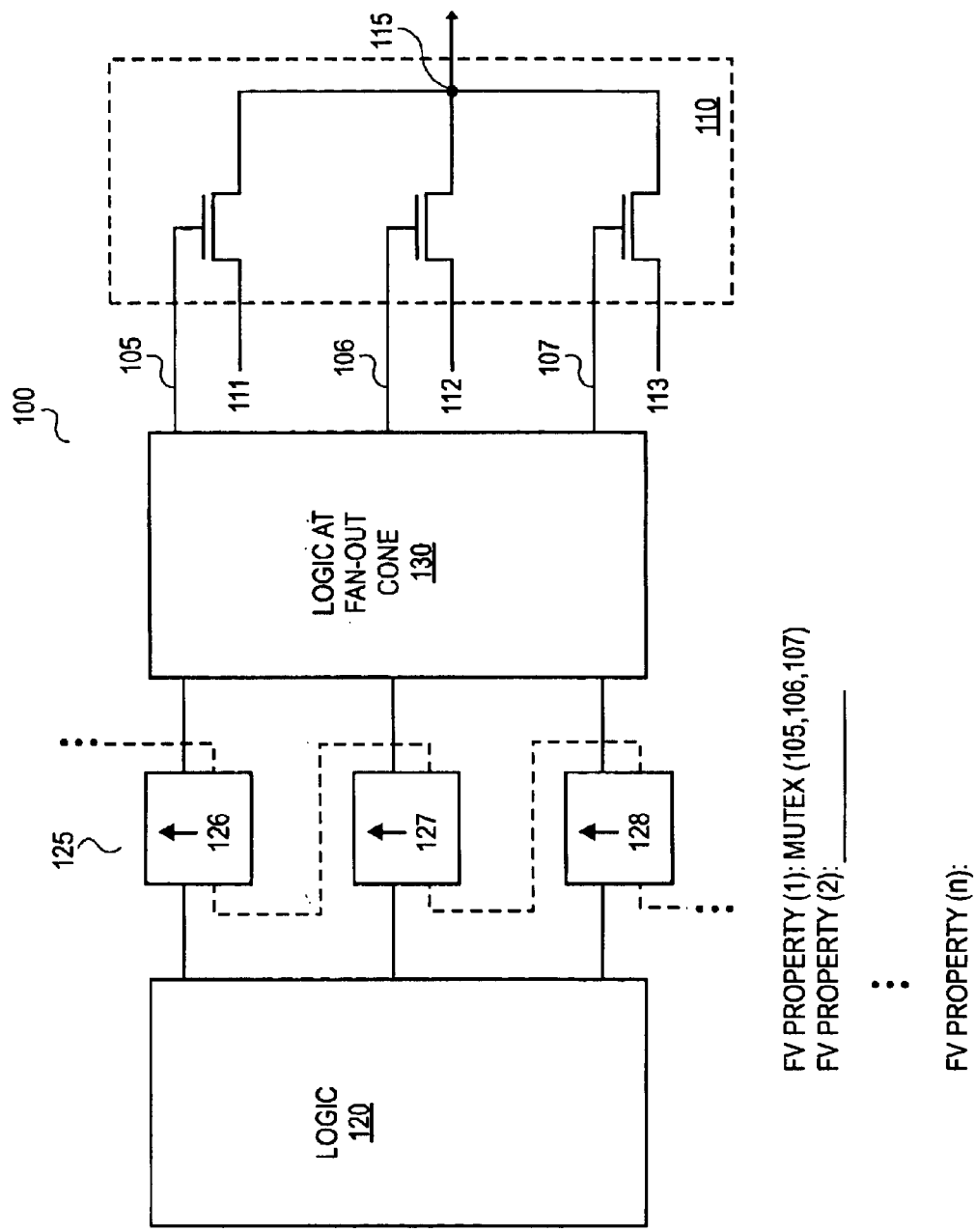
FIG. 1 illustrates an exemplary circuit that may be formally verified.

For the circuit 100 shown in FIG. 1, for example, the scan chain 125 is a sequential logic boundary. Thus, when verifying the circuit block to the right of the scan chain 125 (i.e. at the output of the scan cells 126–128), a functional condition is specified for the control lines 105–107 to indicate that no more than one of the control lines 105–107 can be asserted at the same time (e.g. MUTEX (105, 106, 107)). The functional condition is communicated through the logic 130 during the formal verification process. As mentioned above, this functional condition is typically satisfied by the function performed by the preceding logic 120. During formal verification, however, the preceding logic 120 does not have control over values on the control lines 105–107

Other FV properties, shown as FV properties (2) through (n) in FIG. 1, may also be specified at the sequential boundary corresponding to the scan chain 125. The other FV properties may or may not place conditions on the logical values to be applied to the control lines 105–107. Examples of other types of FV properties may include, for example, a SAME property to specify that logical values associated with two or more signal lines should be the same, or an INVERSE property to specify that logical values associated with two signal lines should be opposite from each other. Other types of FV properties are within the scope of various embodiments.

Referring back to FIG. 3, at block 310, a formal verification process is performed to verify the schematic against the RTL model to ensure that they are equivalent. This first pass formal verification process may be used to identify issues with the schematic as compared to the RTL model that are associated with a normal (functional) mode of operation of the integrated circuit chip and not necessarily with scan cell operation. For one embodiment, the FV process is performed on combinatorial logic blocks one at a time. During the FV process for a schematic including the circuit 100 of FIG. 1, for example, all possible input value combinations for the input lines 111–113 and for the control lines 105–107 are tested.

Assumptions are generated from contention sites in the RTL model and/or in the schematic if it is implemented with a contention configuration. The FV properties are specified to satisfy the assumptions. When a sequential boundary is encountered during an FV process, the specified FV properties generate 1) functional conditions to satisfy the assumptions made in the logic driven at the sequential boundary and 2) assumptions to be proven in driving the sequential boundary so that 1) will be true.

Following the FV process, the assumptions are validated using an FV assumption verification process. Assumption verification involves determining whether assumptions are valid or not (i.e. pass or fail) during the FV process. Because FV properties are typically included in an integrated circuit model to satisfy assumptions, removing FV properties can cause assumptions to fail.

At block 315, FV properties associated with scan cell functional outputs in the integrated circuit are removed from the overall list of FV properties for the RTL model for one embodiment. For one embodiment, such FV properties are indicated as being associated with one or more scan cells and are thus, easy to identify within the overall set of FV properties for the integrated circuit. This correspondence may be indicated by the designer when specifying the FV properties for one embodiment such that no additional work is required to provide this indication over what is done for a typical FV process.

Referring to the circuit of FIG. 1 for purposes of example, at block 315 (FIG. 3), FV properties (1) through (n) at the functional outputs of the scan chain 125 (including the scan cells 126–128) are removed at this point. These properties are identified to be removed because of their indicated correspondence with the scan chain 125 including the scan cells 126–128. This correspondence may be indicated, for example, by using a particular naming convention for the FV properties that identifies scan chains and/or scan cells. Other approaches for indicating a correspondence are within the scope of various embodiments. Other FV properties that are not associated with scan chains and/or scan cells are not removed.

Once the appropriate FV properties associated with scan cells have been removed at block 315, then in block 320, a formal verification assumption verification process is performed on the RTL model to validate assumptions generated from the modified set of FV properties. At block 325, it is determined whether any assumptions failed during the assumption verification process. If so, then at block 330, the FV property(ies) associated with the failed assumption(s) are removed from the overall set of FV properties and at block 320, the assumption verification process is performed again. Using this iterative process, all FV properties directly or indirectly associated with scan cells are removed from the overall list of FV properties.

At decision block 325, when it is determined that there are no additional assumption failures, then at block 335, an assumption verification process is performed on the schematic using assumptions generated from the reduced set of FV properties identified at blocks 315–330.

With the FV properties associated with scan cell functional outputs removed, output data from the formal verification assumption verification process performed at block 335 indicates at block 340, potential contention sites associated with scan cell outputs. For the circuit 100 of FIG. 1, a potential contention site at the output node 115 may be identified in this manner. The potential contention sites may be identified, for example, by a particular node name or location in the schematic. Other approaches for indicating potential contention sites are within the scope of various embodiments.

As described above, multiple FV properties may be specified in association with a single set of scan cell functional outputs. For one embodiment, if a potential contention site is identified at block 340, the cause of the contention and/or the particular FV property or properties associated with the contention may be determined in the manner described with reference to FIG. 4.

At block 405, where there are multiple FV properties associated with a given contention site, it is determined which of the removed FV properties is/are associated with the contention (i.e. which of the FV properties prevent contention at the identified site). For one embodiment, this is done in an iterative manner to identify the one or more FV properties associated with the identified contention.

For example, all FV properties removed at blocks 315 and 330 in FIG. 3 may be added back in to the FV properties 257 (FIG. 1) and then removed one at a time. After the removal of each FV property, an FV assumption verification pass is performed to determine whether contention is still detected at the indicated site. Various subsets of the FV properties (1) through (n) associated with the scan chain 125 of the circuit 100, for example, may be removed followed by verification of the circuit 100. In this manner, it can be determined which of the FV properties (1) through (n) are needed to avoid contention at the output node 115.

Alternatively, the particular FV property(ies) that are needed to avoid contention at a particular site may be identified by tracing back from a potential contention site within the schematic to identify necessary functional conditions on inputs to the circuit block including the contention site. For some embodiments, it may be possible to trace back through the schematic using one of the tools used to develop the schematic, for example.

Once it is determined which FV property(ies) are needed to avoid contention at a given node, it may be useful for some embodiments to determine in more detail the circumstances under which contention occurs. At block 410, a contention site is analyzed. At decision block 415, it is determined whether contention is caused at the site as vectors are shifted through a scan chain associated with the contention site. If so, at block 420, a design change may be identified to correct the problem. If the contention is instead caused when the vectors are applied to the corresponding scan cell fan-out cone or other logic at scan cell outputs after vector shift, then, the method continues at block 425. At block 425, the FV property(ies) responsible for preventing contention at the contention location being analyzed (determined at block 405) are identified to be provided to an automatic test pattern generator, for one embodiment.

For one embodiment, in the schematic, scan cells and/or scan chains may be named in a manner to indicate whether or not their outputs toggle during a scan shift operation. This naming convention can then be used at block 415 to determine whether or not the contention is caused during a scan shift operation. For example, if the outputs of the scan cell(s) and/or scan chain(s) associated with the FV property being analyzed are indicated as having outputs that toggle during scan shift and do not turn off the bus/multiplexer drivers all at the same time, it may be assumed that contention is caused during a scan shift operation. In this case, a design change may be indicated. Alternatively, if scan cell(s) and/or scan chain(s) of interest are identified as having outputs that do not toggle during scan shift, it may be assumed that contention is caused when values shifted into the scan cell(s) and/or chain(s) are applied to logic at scan cell outputs. Other approaches to determining when contention may be caused are within the scope of various embodiments.

At decision block 430, it is determined whether there are more contention sites to analyze. If so, then at block 435, a next contention site is selected and the method continues as described.

Figure 4:
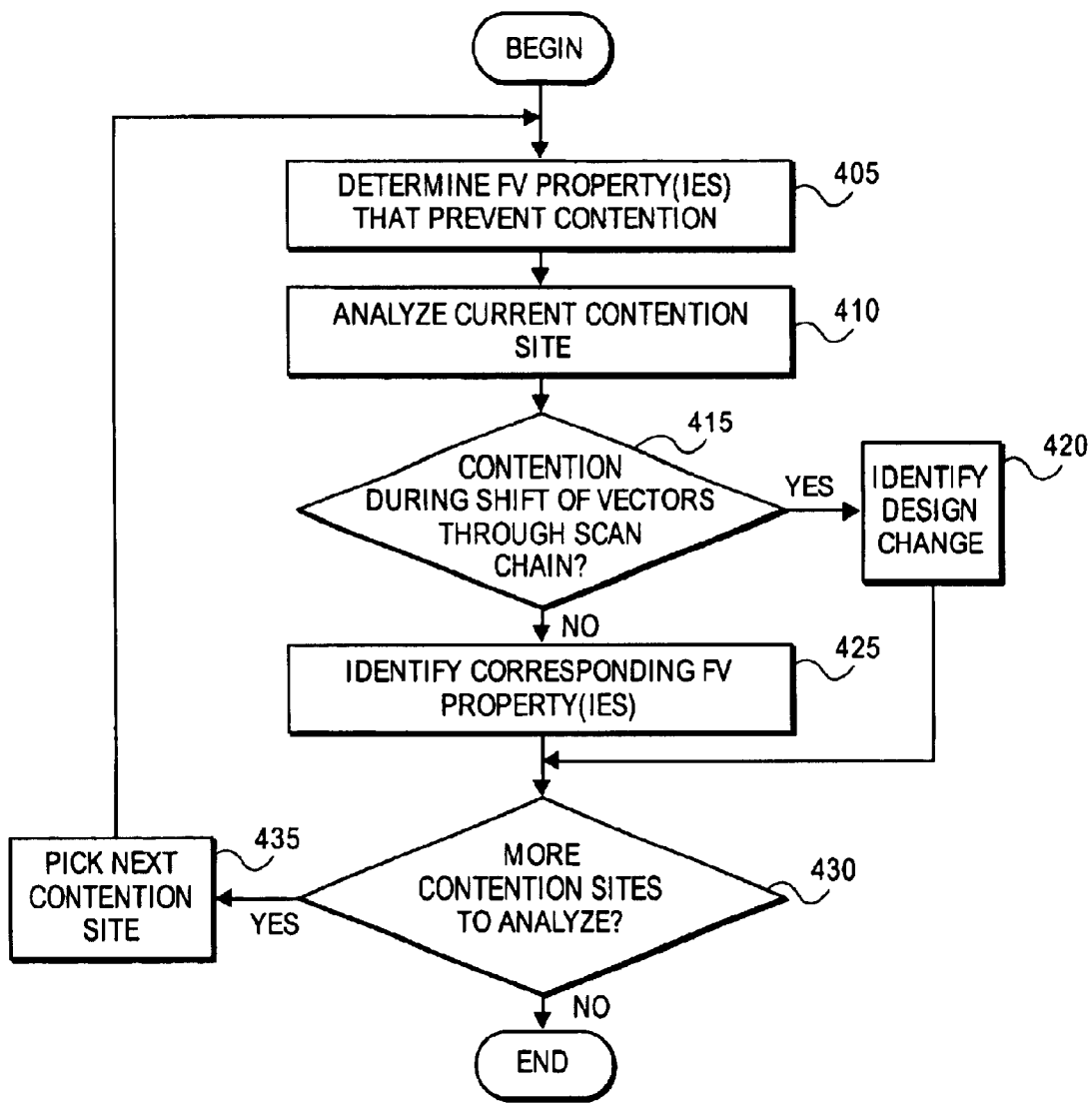
FIG. 4 is a flow diagram showing the method of one embodiment for analyzing potential contention sites identified in the flow shown in FIG. 3.
Figure 5:
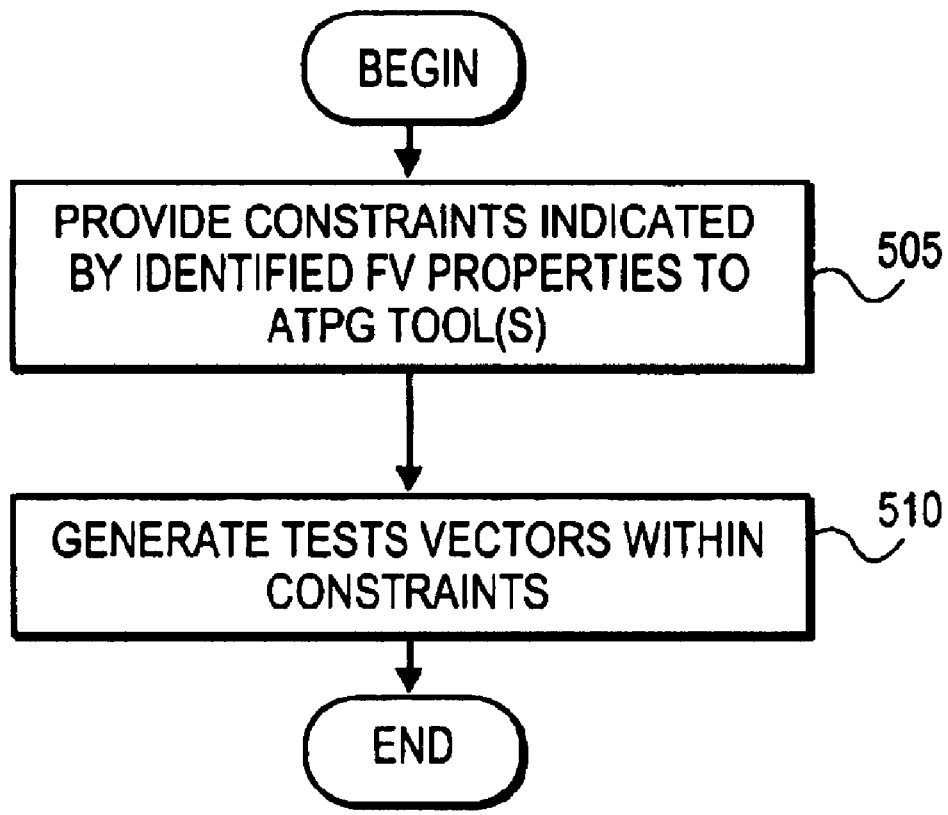
FIG. 5 is a flow diagram showing the method of one embodiment for generating test vectors for an integrated circuit.

FIG. 5 is a flow diagram showing a method of one embodiment for automatically generating test vectors for a circuit analyzed in accordance with the methods described above. At block 505, functional conditions indicated by the FV properties identified at block 425 in FIG. 4 are provided as constraints to an ATPG tool such as the ATPG tool 260 of FIG. 1. For some embodiments, some translation from FV property to ATPG tool constraint may be performed to provide the constraints in a format that can be processed by the ATPG tool. At block 505, test vectors are generated using the indicated constraints such that only test vectors that meet the constraints are provided by the ATPG tool.

For one embodiment, the ATPG tool is one of the FastScan™ or FlexTest™ ATPG tools from Mentor Graphics Corporation of Wilsonville, Oreg. For other embodiments, a different type of ATPG tool may be used.

Using the above-described methods, test vector development may be targeted such that only test vectors determined to be likely to cause contention are removed from the available test vector set. In this manner, test coverage is not unduly compromised when limiting the test vector set to avoid contention at given nodes. Some embodiments may, therefore, help to enable structural testing for some integrated circuits that have previously been limited to functional testing.

These approaches are advantageous as compared to a process in which all FV properties associated with scan cell functional outputs are provided directly to an ATPG tool without performing an intermediate FV process, for example. Such an approach may unnecessarily reduce the number of test vectors generated because some FV properties may not specify functional conditions that are needed to avoid contention at a given site.

The above-described approaches may also provide advantages as compared to the capabilities of currently available ATPG tools. Some ATPG tools may include some capabilities for limiting a test vector set to avoid contention. These capabilities, however, may not be sufficient to identify test vectors associated with potential contention sites caused by including scan cells in an integrated circuit. Further, these capabilities may unnecessarily eliminate test vectors that do not cause contention, thereby reducing test coverage.

Further, the methods described above are more efficient than manually reviewing all FV properties to determine which properties may cause contention. The number of FV properties for a given integrated circuit can be very large such that it would require a significant amount of time and effort to manually review all FV properties to determine which ones specify functional conditions needed to avoid contention. Further, FV properties may be associated with many different circuit blocks for any particular integrated circuit. A typical integrated circuit design team may include over one hundred design engineers responsible for various blocks of the integrated circuit. A manual review of FV properties for an entire integrated circuit chip would involve coordination across all of the various groups within the design team to understand FV properties that may cross various circuit blocks.

Using the scan design method and apparatus of some embodiments, potential contention sites due to scan design may be identified relatively early in the design cycle, as soon as a switch-level schematic is available, such that any design changes may be easier and require less time and expense to make.

Embodiments of the invention may be less prone to human error than some prior approaches to identifying contention sites due to scan design because many processes can be automated using FV tools. Further, some embodiments may be more efficient and consume less CPU time than exhaustively simulating all possible test vectors in and below the full chip level.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
   removing a formal verification property associated with a scan cell from a set of formal verification properties to create a reduced set of formal verification properties; and performing an assumption verification process on a schematic using assumptions generated from the reduced set of formal verification properties, an output of the assumption verification process to indicate whether there is a potential contention site at logic coupled to the output of the scan cell.

2. The method of claim 1 wherein removing a formal verification property includes removing all formal verification properties associated with a scan cell.

3. The method of claim 2 further comprising:
if the assumption verification process indicates that there is a potential contention site, determining which of the removed formal verification properties prevents the contention.

4. The method of claim 3 wherein determining includes iteratively performing the assumption verification process with subsets of the formal verification properties removed.

5. The method of claim 1 further comprising:
if the assumption verification process indicates a potential contention site, determining whether the contention is caused during shifting of a vector through the scan cell or when the vector is applied to the scan cell functional output.

6. A method comprising:
applying a constraint to an automatic test pattern generation tool, the constraint being associated with a contention site that is revealed by removing a formal verification property associated with a functional output of a scan cell and performing an assumption verification process on a schematic with the formal verification property removed; and
generating test vectors using the constraint.

7. A method comprising:
removing a formal verification property associated with a functional output of a scan cell;
performing an assumption verification process on an integrated circuit schematic with the formal verification property removed;
determining whether logic coupled to the output of the scan cell includes a potential contention site based on a result of the assumption verification; and
if the logic includes a potential contention site, determining whether contention is caused during a scan shift operation or when a vector is applied to the fan-out cone.

8. The method of claim 7 wherein removing a formal verification property includes removing a formal verification property associated with a Register Transfer Level (RTL) model of the integrated circuit.

9. The method of claim 8 wherein removing a formal verification property includes removing all formal verification properties associated with scan cell functional outputs.

10. The method of claim 9 wherein removing all formal verification properties associated with scan cell functional outputs includes
identifying one or more formal verification properties directly associated with a scan cell functional output;
performing an assumption verification process on the RTL model with one or more formal verification properties removed;
removing any additional formal verification properties associated with assumptions that fail during the assumption verification process; and
repeating performing and removing until there are no assumption failures during the assumption verification process.

11. The method of claim 9 further comprising:
determining which of the removed formal verification properties prevents contention at the potential contention site in the logic.

12. The method of claim 11 wherein determining which of the removed formal verification properties prevents contention includes iteratively analyzing the potential contention site with subsets of the formal verification properties removed using the assumption verification process.

13. The method of claim 11 wherein determining which of the removed formal verification properties prevents contention includes tracing back through the schematic from the potential contention site.

14. The method of claim 7 wherein determining whether contention is caused during a scan shift operation includes identifying whether the scan cell outputs toggle during a shift operation.

15. An article comprising a medium that stores instructions that cause a processor-based system to perform a method comprising:
applying a constraint to an automatic test pattern generation tool, the constraint being associated with a contention site that is revealed by removing a formal verification property associated with a functional output of a scan cell and performing an assumption verification process with the formal verification property removed; and
generating test vectors using the constraint.

16. An article comprising a medium that stores instructions that cause a processor-based system to perform a method comprising:
removing a formal verification property associated with a scan cell functional output in an integrated circuit model; and
performing an assumption verification process on a schematic of the integrated circuit including the scan cell, the assumption verification process to indicate whether there is a potential contention site at logic coupled to the output of the scan cell.

17. The article set forth in claim 16 wherein removing a formal verification property associated with a scan cell functional output includes removing the formal verification property from an RTL model of the integrated circuit.

18. The article set forth in claim 16 wherein the medium further stores instructions that cause the processor-based system to perform the method comprising:
removing all formal verification properties associated with scan cell functional outputs in the integrated circuit model.

19. The article set forth in claim 18 wherein the medium further stores instructions that cause the processor-based system to perform the method comprising:
determining which of the removed formal verification properties prevents contention at the potential contention site if a potential contention site is indicated.

20. The article set forth in claim 19 wherein determining which of the removed formal verification properties prevents contention at the potential contention site includes iteratively evaluating the removed formal verification properties using the assumption verification process.

* * * * *